United States Patent
Lee et al.

(10) Patent No.: US 10,211,025 B2
(45) Date of Patent: Feb. 19, 2019

(54) DETERMINING A POSITION OF A DEFECT IN AN ELECTRON BEAM IMAGE

(71) Applicant: KLA-Tencor Corporation, Milpitas, CA (US)

(72) Inventors: Hucheng Lee, Cupertino, CA (US); Govindarajan Thattaisundaram, San Jose, CA (US)

(73) Assignee: KLA-Tencor Corp., Milpitas, CA (US)

( * ) Notice: Subject to any disclaimer, the term of this patent is extended or adjusted under 35 U.S.C. 154(b) by 132 days.

(21) Appl. No.: 15/233,971

(22) Filed: Aug. 11, 2016

(65) Prior Publication Data
US 2017/0047195 A1 Feb. 16, 2017

Related U.S. Application Data

(60) Provisional application No. 62/204,314, filed on Aug. 12, 2015.

(51) Int. Cl.
| | |
|---|---|
| *H01J 37/22* | (2006.01) |
| *G06T 7/00* | (2017.01) |
| *H01L 21/66* | (2006.01) |
| *G06T 7/73* | (2017.01) |

(52) U.S. Cl.
CPC .......... *H01J 37/222* (2013.01); *G06T 7/0006* (2013.01); *G06T 7/0008* (2013.01); *G06T 7/74* (2017.01); *H01L 22/12* (2013.01); *H01L 22/20* (2013.01); *G06T 2207/10061* (2013.01); *G06T 2207/20081* (2013.01); (Continued)

(58) Field of Classification Search
CPC . G06T 2207/10061; G06T 2207/20081; G06T 2207/30148; G06T 7/0006; G06T 7/0008; G06T 7/74; G06T 7/60; H01J 2237/24592; H01J 2237/2817; H01J 37/222; H01J 37/28; G01N 21/9501; G01N 21/956; G01N 21/9505; G01N 21/95607; G01N 23/2251; G01N 2021/8887; G01N 2021/95615; H01L 22/12; H01L 22/20
See application file for complete search history.

(56) References Cited

U.S. PATENT DOCUMENTS

| | | |
|---|---|---|
| 7,570,796 B2 | 8/2009 | Zafar et al. |
| 7,676,077 B2 | 3/2010 | Kulkarni et al. |
| 8,664,594 B1 | 4/2014 | Jiang et al. |

(Continued)

OTHER PUBLICATIONS

International Search Report for PCT/US2016/046629 dated Nov. 14, 2016.
Written Opinion for PCT/US2016/046629 dated Nov. 14, 2016.

*Primary Examiner* — Wyatt Stoffa
(74) *Attorney, Agent, or Firm* — Ann Marie Mewherter

(57) ABSTRACT

Methods and systems for determining a position of a defect in an electron beam image of a wafer are provided. One method includes determining a second position of a defect with respect to patterns imaged in a test image based on a first position of the defect in a difference image. The method also includes determining a third position of the defect with respect to the patterns in an electron beam image for the defect and determining an association between the first and third positions. In addition, the method includes determining a position of another defect in an electron beam image based on a first position of the other defect in a difference image and the determined association.

20 Claims, 4 Drawing Sheets

(52) U.S. Cl.
    CPC ........... *G06T 2207/30148* (2013.01); *H01J 2237/24592* (2013.01); *H01J 2237/2817* (2013.01)

(56) References Cited

U.S. PATENT DOCUMENTS

| | | | |
|---|---|---|---|
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 2003/0007677 A1* | 1/2003 | Hiroi | G06T 7/001 382/149 |
| 2003/0025087 A1* | 2/2003 | Schamber | G01N 23/2251 250/491.1 |
| 2005/0200841 A1 | 9/2005 | Talbot et al. | |
| 2007/0023658 A1 | 2/2007 | Nozoe et al. | |
| 2008/0112608 A1* | 5/2008 | Yang | G06T 7/001 382/149 |
| 2009/0134327 A1 | 5/2009 | Ikku et al. | |
| 2011/0155905 A1 | 6/2011 | Hatakeyama et al. | |
| 2012/0114221 A1* | 5/2012 | Satou | G06T 7/001 382/149 |
| 2014/0270474 A1* | 9/2014 | Huang | G06T 7/0004 382/149 |
| 2016/0033420 A1* | 2/2016 | Baris | G03F 7/70466 356/73 |
| 2016/0104600 A1* | 4/2016 | Luo | G05B 19/401 250/310 |
| 2016/0321800 A1* | 11/2016 | Thattaisundaram | G06T 7/001 |

* cited by examiner

DETERMINING A POSITION OF A DEFECT IN AN ELECTRON BEAM IMAGE

BACKGROUND OF THE INVENTION

1. Field of the Invention

The present invention generally relates to methods and systems for determining a position of a defect in an electron beam image of a wafer.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on the wafer where defects have been detected by inspection. The higher resolution data for the defects generated by defect review is more suitable for determining attributes of the defects such as profile, roughness, more accurate size information, etc.

In order for defect review to provide useful information about the defects that are reviewed, when performing defect review for a particular defect detected by inspection, the defect review process or tool must be able to ensure that the area on the wafer being imaged during the defect review process actually contains the defect being reviewed. However, not all defects that are detectable on an optical inspection system are also detectable on a electron beam defect review system. For example, it may not be possible to generate images of some actual, or real, defects that are detected by an optical inspection system such as previous layer defects in electron beam images. In one such example, it is generally not possible to generate electron beam images of anything below the upper surface of a wafer because electrons do not penetrate below the upper surface of the wafer. Real defects that are detected by optical inspection but cannot be redetected in electron beam images are generally referred to as SEM non-visuals, or "SNVs." Therefore, when trying to redetect a defect in an electron beam image that cannot actually be imaged by an electron beam tool, it can be impossible to determine if the actual defect location has been found but the defect cannot be imaged by the electron beam tool or if the actual defect location has not been found because the defect has not been redetected in the predicted location (i.e., the predicted location is incorrect). In addition, since many patterns repeat in designs formed on wafers, and sometimes within a relatively small area on a wafer (as relatively small patterns repeat at substantially small periods throughout an array region of some designs for wafers), it can be difficult to determine if the correct defect location has been found in an electron beam image even if a defect is redetected (e.g., because the pattern(s) at or near which a defect was detected occur in multiple instances in the same electron beam image generated for the determined defect position).

Currently, there is no known utility to automatically predict the location of SNVs in an electron beam image on array (e.g., SRAM) regions based on the location of the defect detected by an inspection tool. Experienced users may perform electron beam image to optical image correlation manually and use the defect location accuracy of the defects that are detectable in electron beam images to come up with a reasonable prediction of the exact locations of real SNVs on electron beam images.

There are, therefore, several disadvantages to the currently used methods for relocating defects detected by inspection in defect review. For example, the currently used methods can work only if the defect lies in a logic region, where many patterns are unique relative to other patterns a relatively small area and can therefore be used for defect relocation, or if the defect signal is visible in an electron beam image (as SEM real defects) for inexperienced users. The process is totally manual and time consuming, which requires a lot of experience. Moreover, current methods are not robust to optical image distortions, even for logic regions.

Accordingly, it would be advantageous to develop systems and methods for determining a position of a defect in an electron beam image of a wafer that do not have one or more of the disadvantages described above.

SUMMARY OF THE INVENTION

The following description of various embodiments is not to be construed in any way as limiting the subject matter of the appended claims.

One embodiment relates to a system configured for determining a position of a defect in an electron beam image of a wafer. The system includes an electron beam defect review subsystem that includes at least an electron beam source and a detector. The electron beam source is configured to generate electrons that are directed to a wafer. The detector is configured to detect electrons from the wafer and to generate electron beam images responsive to the detected electrons. The system also includes a computer subsystem coupled to the electron beam defect review subsystem. The computer subsystem includes one or more processors that execute instructions from a memory medium.

The computer subsystem is configured for determining a first position of a defect in a difference image generated for the wafer. The difference image is generated by subtracting a reference image from a test image for an area on the wafer in which the defect is located. The test image is generated for the wafer by an optical inspection system. The defect is detected on the wafer by the optical inspection system. The computer subsystem is also configured for determining a second position of the defect with respect to patterns formed on the wafer and imaged in the test image based on the first position of the defect in the difference image. In addition, the computer subsystem is configured for determining a third position of the defect with respect to the patterns imaged in an electron beam image generated for the defect on the wafer by the electron beam defect review subsystem. The computer subsystem is further configured for determining an association between the first and third positions.

The computer subsystem is also configured for determining a position of another defect in an electron beam image generated for the other defect on the wafer by the electron beam defect review subsystem. The position of the other defect is determined based on a first position of the other defect in another difference image generated for the wafer and the determined association. The other defect is detected on the wafer by the optical inspection system. The other difference image is generated by subtracting a reference image from a test image for an area on the wafer in which the other defect is located. The test image used to generate the other difference image is generated for the wafer by the optical inspection system. The system may be further configured as described herein.

Another embodiment relates to a computer-implemented method for determining a position of a defect in an electron beam image of a wafer. The method includes the steps described above. The steps of the method are performed by a computer system. Each of the steps of the method described above may be further performed as described further herein. In addition, the embodiment of the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for determining a position of a defect in an electron beam image of a wafer. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
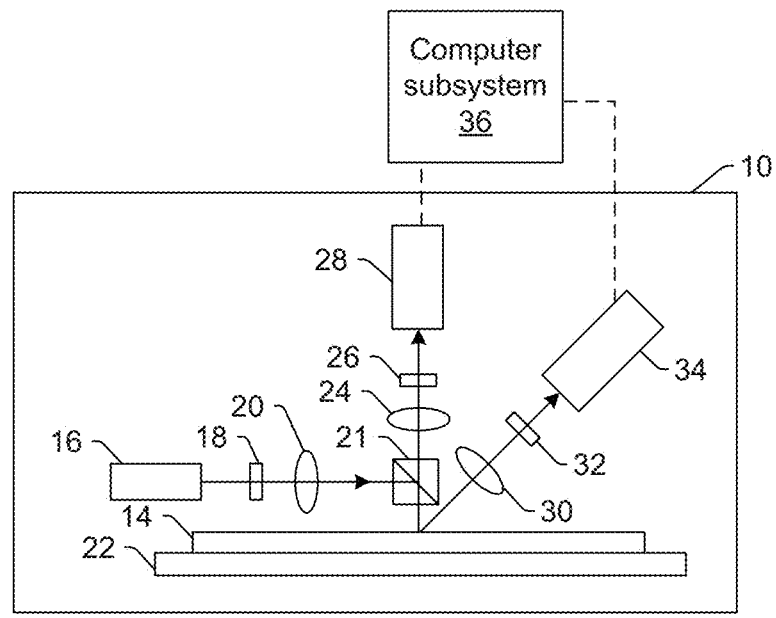
FIG. 1 is a schematic diagram illustrating a side view of an embodiment of an optical inspection system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design analysis. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

Preferably, the "design" or "physical design" as those terms are used herein refer to the design as it would be ideally formed on the specimen. For example, a design or physical design described herein would preferably not include features of the design that would not be printed on a wafer such as optical proximity correction (OPC) features, which are added to the design to enhance printing of the features on the wafer without actually being printed themselves. In this manner, in some embodiments, the design for the wafer used for the steps described further herein does not include features of the design that will not be printed on the wafer.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured for identifying locations of defects including scanning electron microscope (SEM) non-visual (SNV) defects from electron beam images (e.g., SEM images). In particular, the embodiments described herein are configured for automatically identifying defect signal locations on an electron beam image for SNVs and defects. For example, when SEM review is performed on defect locations detected by inspection tools, a majority of the population of the defects show no signal on the SEM images. These events are called SEM non-visuals or SNVs. SNVs are generally considered nuisance events since they could be previous layer defects, subtle critical dimension (CD) variations, and surface roughness or line edge roughness, which are not killer defect of interest (DOI) types for semiconductor wafer fabrication. For such cases, it is a non-trivial and arduous task to understand the location in an electron beam image to which the defect signal of the real event actually corresponds. It is therefore extremely difficult to reliably and automatically find the defect location on electron beam images for SNVs, even when those SNVs have relatively good signals in inspection images.

Locating defect signals of events detected by inspection in electron beam images is particularly difficult in a number of additional instances. The term "events" is generally defined herein as any potential defect detected by inspection, which typically includes actual or real defects, nuisance type defects (or nuisance events), and noise. For example, locating the defect signal in electron beam images is particularly difficult when the defect lies on the array or SRAM region, which is made of repeating structures in both x and y directions. In another example, locating the defect signal in electron beam images is particularly difficult when the defect review tool has a non-zero skew that causes the defect to not lie exactly in the center of the electron beam image. Locating the defect signal in electron beam images is also particularly difficult when the inspection pixel size (i.e., the pixel size of the inspection tool used for detecting the defects on the wafer) is not small enough to resolve the underlying pattern. In addition, locating the defect signal in electron beam images is particularly difficult when there is significant distortion and/or noise in the inspection images.

The embodiments described herein provide a machine-learning methodology, which has two phases—a training phase and a prediction phase, which are described further herein. As is described further herein, the embodiments provide a machine learning system that can learn the association of inspection-detected events and positions of those defects in defect review images using a training data set of defects that are detected by inspection (i.e., inspection-real events) and redetected by defect review (e.g., SEM real defects). The embodiments described herein can also use the learning performed by the embodiments to predict with confidence the location in electron beam images of all defects from the same inspection results, including SNV.

The training phase described herein may be performed for one wafer and results generated in that training may be applied for predicting defect locations in electron beam images generated for other wafers. However, if there are process variations across wafers that could cause pattern level variations on the wafers, then the training phase may be performed separately for different wafers. In addition, if the optical mode used for detecting defects on different wafers is different, then the training phase may be performed separately for the different wafers.

Understanding nuisance sources (i.e., causes of nuisance event detection) is critical in tuning inspection recipes to suppress nuisance. The embodiments described herein provide a means for reliably and accurately identifying nuisance sources in inspection results, which can be used to tune inspection recipes to eliminate the detection of those identified nuisance sources. In addition or alternatively, the embodiments described herein can be configured to identify and classify defects detected by inspection as nuisance events or nuisance defects. In this manner, the detected defects that are classified as nuisance events or nuisance defects can be eliminated from the inspection results thereby effectively increasing the sensitivity of the inspection. Therefore, the embodiments potentially allow the optical inspection tool to be run much deeper into the noise floor while keeping the DOIs with substantially low signals at a reasonable nuisance rate. As such, the embodiments described herein allow optical inspection tools to be run with much higher sensitivities which would otherwise have to be sacrificed in the interest of minimizing the nuisance rate or at least managing the nuisance rate at an acceptable level.

One embodiment relates to a system configured for determining a position of a defect in an electron beam image of a wafer. The wafer may include any wafer known in the art.

As described further herein, optical images such as test images may be generated for wafers and defects by an optical inspection system. The optical inspection system may also detect defects on a wafer. The systems described herein may or may not include such an optical inspection system. For example, the embodiments described herein may acquire information from an optical inspection system or a storage medium in which the optical inspection system has stored results of inspection such as images and information for defects detected on a wafer. The information and results may be acquired in any suitable manner. However, in other instances, the embodiments described herein may include an optical inspection system in addition to other components described herein thereby providing a complete solution for inspection and defect review. In instances in which the system includes an optical inspection system, the optical inspection system may be coupled to a computer subsystem of the system as described further herein.

One embodiment of an optical inspection system is shown in FIG. 1. The optical inspection system includes an imaging subsystem that includes at least a light source and a detector. The light source is configured to generate light that is directed to a wafer. The detector is configured to detect light from the wafer and to generate images responsive to the detected light.

In the embodiment of the optical inspection system shown in FIG. 1, imaging subsystem 10 includes an illumination subsystem configured to direct light to wafer 14. The illumination subsystem includes at least one light source. For example, as shown in FIG. 1, the illumination subsystem includes light source 16. In one embodiment, the illumination subsystem is configured to direct the light to the wafer at one or more angles of incidence, which may include one or more oblique angles and/or one or more normal angles. For example, as shown in FIG. 1, light from light source 16 is directed through optical element 18 and then lens 20 to beam splitter 21, which directs the light to wafer 14 at a normal angle of incidence. The angle of incidence may include any suitable angle of incidence, which may vary depending on, for instance, characteristics of the wafer and the defects to be detected on the wafer.

The illumination subsystem may be configured to direct the light to the wafer at different angles of incidence at different times. For example, the optical inspection system may be configured to alter one or more characteristics of one or more elements of the illumination subsystem such that the light can be directed to the wafer at an angle of incidence that is different than that shown in FIG. 1. In one such example, the optical inspection system may be configured to move light source 16, optical element 18, and lens 20 such that the light is directed to the wafer at a different angle of incidence.

In some instances, the optical inspection system may be configured to direct light to the wafer at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the wafer at the same time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times (e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing the light having different or the same characteristics to the wafer at different or the same angles of incidence sequentially or simultaneously.

In one embodiment, light source 16 may include a broadband plasma (BBP) light source. In this manner, the light generated by the light source and directed to the wafer may include broadband light. In instances in which the light source is or includes a BBP light source, the optical inspection system may be referred to as a BBP inspection system and the inspection performed by the optical inspection system may be referred to as BBP inspection. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the optical inspection system may be configured to alter one or more of the elements of the illumination subsystem based on the type of illumination to be used for imaging.

The optical inspection system may also include a scanning subsystem configured to cause the light to be scanned over the wafer. For example, the optical inspection system may include stage 22 on which wafer 14 is disposed during inspection. The scanning subsystem may include any suitable mechanical and/or robotic assembly (that includes stage 22) that can be configured to move the wafer such that the light can be scanned over the wafer. In addition, or alternatively, the optical inspection system may be configured such that one or more optical elements of the optical inspection system perform some scanning of the light over the wafer. The light may be scanned over the wafer in any suitable fashion.

The optical inspection system further includes one or more detection channels. At least one of the one or more detection channels includes a detector configured to detect light from the wafer due to illumination of the wafer by the optical inspection system and to generate images responsive to the detected light. For example, the optical inspection system shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 1 shows an embodiment of the optical inspection system that includes two detection channels, the optical inspection system may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels of the optical inspection system may be signals or data, but not image signals or image data. In such instances, a computer subsystem such as computer subsystem 36 of the optical inspection system may be configured to generate images of the wafer from the non-imaging output of the detectors. However, in other instances, the detectors may be configured as imaging detectors that are configured to generate image signals or image data. Therefore, the optical inspection system may be configured to generate the images described herein in a number of ways.

It is noted that FIG. 1 is provided herein to generally illustrate a configuration of an optical inspection system that may be included in or coupled to a system described herein. Obviously, the optical inspection system configuration described herein may be altered to optimize the performance of the optical inspection system as is normally performed when designing a commercial inspection system. In addition, the embodiments described herein may be implemented using an existing optical inspection system (e.g., by adding functionality described herein to an existing inspection system) such as the 29xx/28xx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 of the optical inspection system may be coupled to the detectors of the optical inspection system in any suitable manner (e.g., via one or more transmission media, which may include "wired" and/or "wireless" transmission media) such that the computer subsystem can receive the images generated by the detectors during scanning of the wafer. Computer subsystem 36 may be configured to perform a number of functions using the images generated by the detectors. For example, the computer subsystem of the optical inspection system may be configured to detect defects on the wafer using the images and in any suitable manner known in the art (e.g., in a cell-to-cell inspection method in which an image generated for one cell on a wafer is compared to an image generated for another cell on the wafer and any differences between the two images may be compared to a threshold to determine if the difference correspond to defects on the wafer). This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes an optical inspection system (in addition to an electron beam defect review subsystem and computer subsystem configured as described further herein), then the computer subsystem of the optical inspection system may be coupled to another computer subsystem described herein such that images, data, information, instructions, etc. can be sent between the computer subsystems as described further herein. For example, computer subsystem 36 shown in FIG. 1 may be coupled to computer subsystem 124 shown in FIG. 2 by any suitable transmission media (not shown), which may include any suitable wired and/or wireless transmission media known in the art. Two or more of such computer subsystems may also be effectively coupled by a shared computer-readable storage medium (not shown).

Although the inspection system is described above as being an optical or light-based inspection system, the inspection system may be an electron beam-based inspection system. For example, in one embodiment, the energy directed to the wafer during inspection includes electrons, and the energy detected from the wafer during inspection includes electrons. Such an electron beam based inspection system may be further configured as described herein, with appropriate changes to modify the electron beam defect review subsystem from being configured for defect review to being configured for inspection.

The system includes an electron beam defect review subsystem that includes at least an electron beam source and a detector. The electron beam source is configured to generate electrons that are directed to a wafer, and the detector is configured to detect electrons from the wafer and to generate electron beam images responsive to the detected electrons. In one such embodiment shown in FIG. 2, the electron beam defect review subsystem includes electron column 122, which is coupled to computer subsystem 124.

Figure 2:
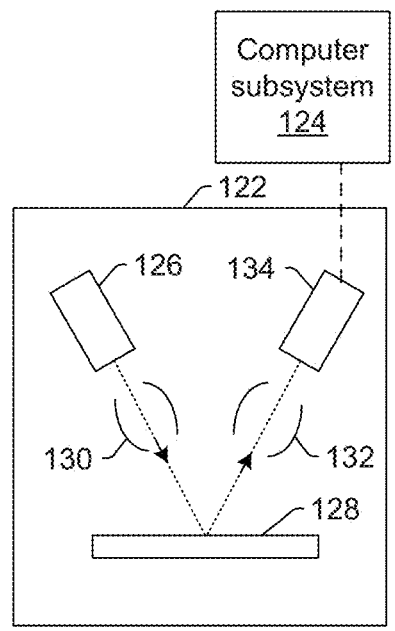
FIG. 2 is a schematic diagram illustrating a side view of an embodiment of a system configured as described herein.

As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S.

Pat. No. 8,716,662 issued May 6, 2014 to MacDonald et al., which are incorporated by reference as if fully set forth herein.

Although the electron column is shown in FIG. 2 as being configured such that the electrons are directed to the wafer at an oblique angle of incidence and are scattered from the wafer at another oblique angle, it is to be understood that the electron beam may be directed to and scattered from the wafer at any suitable angles. In addition, the electron beam-based imaging subsystem may be configured to use multiple modes to generate images of the wafer (e.g., with different illumination angles, collection angles, etc.). The multiple modes of the electron beam defect review subsystem may be different in any image generation parameters of the electron beam defect review subsystem.

Computer subsystem 124 is coupled to the electron beam defect review subsystem. For example, computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein and may be further configured as described herein. For example, as described further herein, the computer subsystem includes one or more processors that execute instructions from a memory medium. A system that includes the electron beam defect review subsystem shown in FIG. 2 may be further configured as described herein.

It is noted that FIG. 2 is provided herein to generally illustrate a configuration of an electron beam defect review subsystem that may be included in the embodiments described herein. The electron beam defect review subsystem configuration described herein may be altered to optimize the performance of the electron beam defect review subsystem as is normally performed when designing a commercial defect review system. In addition, the systems described herein may be implemented using an existing defect review system (e.g., by adding functionality described herein to an existing defect review system) such as the eDR-xxxx series of tools that are commercially available from KLA-Tencor. For some such systems, the embodiments described herein may be provided as optional functionality of the system (e.g., in addition to other functionality of the system). Alternatively, the system described herein may be designed "from scratch" to provide a completely new system.

The computer subsystem is configured for determining a first position of a defect in a difference image generated for the wafer. In this manner, the computer subsystem may determine a location of a defect signal from a difference image. This step may be performed during a training phase for the embodiments described herein. In addition, this step may be performed for each defect in a sample, which may be generated as described herein, during the training phase.

The difference image is generated by subtracting a reference image from a test image for an area on the wafer in which the defect is located. The difference image may be generated in any suitable manner known in the art. In many instances, difference images are generated as described above in the normal course of a wafer inspection process. Therefore, the difference images described herein may be generated by the optical inspection system during inspection of the wafer.

The test image is generated for the wafer by an optical inspection system. For example, test images may be acquired for the wafer by the optical inspection system as described further herein (e.g., by scanning light over the wafer and grabbing test images during the scanning).

The reference image may be any suitable reference image known in the art. For example, the test image may be acquired at one instance of pattern(s) formed on a wafer and the reference image may be acquired at another instance of the pattern(s) formed on the wafer. Therefore, the test and reference images may be generated by the optical inspection system. However, the reference image may be a different reference image, which may be generated from multiple images acquired of the wafer, one or more simulated images (e.g., simulated from design data for the wafer), etc. Therefore, the optical inspection system may or may not generate the reference image by imaging a physical version of the wafer.

The defect is detected on the wafer by the optical inspection system. The defect may be detected on the wafer as described further herein or in any other suitable manner known in the art.

The computer subsystem is also configured for determining a second position of the defect with respect to patterns formed on the wafer and imaged in the test image based on the first position of the defect in the difference image. In this manner, the relative position of the defect in the test image with respect to the image pattern around it may be determined. For example, since the test images (also commonly referred to as target images) are aligned to their respective reference images (with sub-pixel accuracy) and difference images are generated by subtracting the reference images from their corresponding test images, then the difference images are inherently aligned to their corresponding test images (with sub-pixel accuracy). As such, a position in the test image corresponding to the first position that is determined within the difference image can be easily identified. In other words, the location of a peak event in the difference image can be carried over to the target image to identify the location of the defect event. The relative position of that first position with respect to patterns in the test image can then be determined and is the second position described herein. The second position may be determined with respect to the patterns in the test image in any suitable manner and may have any suitable format known in the art. This step may be performed during the training phase and for each defect in a set being used for training.

The computer subsystem is further configured for determining a third position of the defect with respect to the patterns imaged in an electron beam image generated for the defect on the wafer by the electron beam defect review subsystem. In this manner, the relative position of the defect in the electron beam image with respect to the patterns around it may be determined. As described further herein, this step may be performed for a set of defects identified as SEM real defects (i.e., defects that have been redetected successfully in the electron beam images generated by the electron beam defect review subsystem). Therefore, the third position of the defects in the electron beam images, which are used for this step, can be readily determined from the electron beam images themselves without relying on optical inspection images and/or a user. However, the computer subsystem may receive a user-specified defect location in the electron beam image and then learn the relative position of that defect location to other patterns in the electron beam image. This step may be performed during the training phase and for each defect in a set being used for training.

The computer subsystem is also configured for determining an association between the first and third positions. For example, the computer subsystem may determine an association-rule of the defect with its SEM counterpart. In other words, the computer subsystem may determine an association rule of an optically detected defect to an electron beam detected defect. This step may be performed during the training phase and based on the results of one or more of the steps performed during the training phase. The association may have any suitable configuration known in the art. In addition, the association may be determined as an association-rule or any other format that allows the defect locations in their optical images and electron beam images to be associated with each other and then used to determine electron beam image defect positions based on optical image defect positions as described herein. Although the association may be described herein as being determined based on first and third positions of a defect, it is to be understood that the association may be determined based on the first and third positions, respectively, for a number of different defects detected on the wafer in optical images and redetected in electron beam images generated for the wafer. Determining the association based on first and third positions, respectively, for a number of defects may increase the accuracy with which the association can be used to predict defect locations for other defects in electron beam images.

The computer subsystem is further configured for determining a position of another defect in an electron beam image generated for the other defect on the wafer by the electron beam defect review subsystem. The position of the other defect is determined based on a first position of the other defect in another difference image generated for the wafer and the determined association. For example, the association rule determined by the computer subsystem may be applied to the electron beam image for any other defect detected on the wafer. In this manner, the embodiments described herein may use machine-learning principles to automatically identify defect locations in electron beam images of one or more events detected by an optical inspection system. In addition, the embodiments described herein use a machine learning approach to locate defects in electron beam images that correspond to locations on an optical image. In particular, during this step, the computer subsystem may apply the association-rule (learned in the training phase) to a defect that may or may not have any apparent signal in the electron beam image to predict the location where the inspection defect signal is. This step may be performed during a prediction phase.

The other defect is detected on the wafer by the optical inspection system. The other defect may be detected on the wafer in any suitable manner described herein or known in the art. The other difference image is generated by subtracting a reference image from a test image for an area on the wafer in which the other defect is located. The difference, reference, and test images may be generated as described herein and may include any of the images described herein. The test image used to generate the other difference image is generated for the wafer by the optical inspection system. The test image may be generated for the other defect in any suitable manner described herein.

In one embodiment, the patterns include repeating patterned features. In another embodiment, the patterns correspond to device features in a design for the wafer. In some embodiments, the patterns are located in an array region of a design for the wafer. In a further embodiment, the patterns cannot be used for alignment of the wafer or images generated for the wafer. In some embodiments, the area on the wafer in which the other defect is located contains no alignment sites. For example, the embodiments described herein can locate events in an electron beam image for SRAM regions which do not have significant anchor patterns that can act as alignment sites. In addition, the embodiments described herein can be advantageously used to predict defect locations for defects in an array region. As described further herein, patterns in some areas of a wafer such as array regions may repeat in both x and y and at a relatively high frequency. Therefore, the patterns described herein may include such repeating patterns and may be located in array regions of a wafer. In addition, since the embodiments described herein can determine the position of a defect in an electron beam image using the association rule, the embodiments eliminate the need for using unique patterns in the images for alignment of one image with respect to another and/or as a reference to which relative defect positions are determined. In this manner, the embodiments described herein do not require and do not use alignment sites (or patterns that are suitable for alignment) in order to determine defect positions in electron beam images with relatively high accuracy, even when the defects at the defect positions are not visible in the electron beam images. Furthermore, the patterns to which the relative positions described herein are determined may include actual device features (i.e., features of a device being fabricated on a wafer and/or features that will be used to fabricate device features on the wafer as opposed to features that are purely for alignment) regardless of their uniqueness or lack thereof, which enables the embodiments described herein to be performed for any area on a wafer and with respect to any patterns formed on the wafer.

In one embodiment, the other defect cannot be imaged by the electron beam defect review subsystem. In this manner, the embodiments described herein may use machine-learning principles to automatically identify defect locations of one or more events detected by an optical inspection system, which may include at least some SNV events in the electron beam images. In other words, as described further herein, the embodiments described herein can be used to determine the positions of defects in electron beam images with substantially high accuracy even when the defects are not visible in the electron beam images.

In an additional embodiment, the other defect can be imaged by the electron beam defect review subsystem. For example, although the embodiments described herein are particularly useful for determining positions of SNVs in electron beam images, the embodiments described herein can also or alternatively be used to determine the positions of non-SNVs in electron beam images.

In some embodiments, determining the third position includes determining an initial position of the defect with respect to the patterns in the electron beam image generated for the defect and correcting the initial position for deviations of the initial position from a center of the electron beam image generated for the defect thereby determining the third position. The deviations of the initial position from the center of the electron beam image may be caused by a number of error sources in the systems described herein such as skew of the defect review subsystem. For example, let's say that a user wants to grab an electron beam image around a location, P, which could be (px, py) (in nm with respect to the wafer). Due to stage uncertainty (and other possible error sources) of the defect review subsystem, the image grabbed for location P might not be exactly centered at (px, py), but will have a "skew" that can be considered as a DC shift with respect to (px, py). This DC shift needs to be calibrated out to make sure that the location accuracy is better. This calibration is generally done by taking strong events, i.e., events with strong defect signal (e.g., fall on type defects, etc.), which are substantially easy to locate on electron beam images and then using the offset shift noticed in grabbing those images while grabbing electron beam images for other locations.

However, the embodiments described herein may be configured to automatically and inherently perform minor electron beam image de-skew. In particular, the computer subsystem can be configured to correct the electron beam image de-skew for minor deviations of the defect locations from the center of the electron beam image. Once the electron beam image has been corrected for de-skew, the difference between the initial position used as the defect position in the electron beam image and the final, or third, position can be determined in any suitable manner and in any suitable format. In addition, the computer subsystem may be configured for determining an average de-skew for defect locations in the electron beam images and then using that average de-skew as a bias offset for determining other defect locations. Therefore, the embodiments described herein can apply an inherent de-skew method to reduce defect location uncertainty. In some instances, the electron beam defect review subsystem skew may be determined on a die-row basis from the training data. The de-skew corrections may then be applied to the test data based on which die-row that the test data was generated in. This step may be performed during the training phase and for each defect for which steps in the training phase are performed.

In one such embodiment, the computer subsystem is also configured for determining one or more additional candidate positions for the other defect in the electron beam image generated for the other defect and determining a confidence score for the one or more additional candidate positions based on a difference between the initial position and the third position. In this manner, the embodiments described herein may be configured to inherently perform minor electron beam image de-skew and assign a confidence score to other possible locations within the electron beam image. In particular, for array regions, when there are other possible locations which could have caused the signal, the computer subsystem may assign a confidence score based on the relative de-skew learned during the training phase.

In this manner, the embodiments described herein may resolve uncertainty in the cell (or other repeating or non-unique pattern) that corresponds to the defect location determined by optical inspection. For example, when the defect signal is clearly evident in the electron beam image, the visual correlation is relatively simple and easy. However, in the SNV case, and especially in the array region case where repeating patterns in x and y are generally present, the defect can lie in any of the matching cells in the respective location within a cell (i.e., the cell relative location). The embodiments described herein, however, resolve this uncertainty using the bias-offset determined from the training data and assign confidence levels to other possible cells to correct for the electron beam defect review subsystem location accuracy variations.

In another embodiment, the computer subsystem is configured for determining one or more additional candidate positions for the other defect in the electron beam image generated for the other defect by comparing the test image generated for the other defect with other test images generated for one or more additional areas on the wafer by the wafer inspection system, and the one or more additional areas are located within a field of view (FOV) of the electron beam defect review subsystem with which the image for the other defect was generated. For example, in addition to other functions described herein (e.g., predicting SNV locations on electron beam images), as a byproduct of these functions, the embodiments described herein can also indicate the other possible locations (within the electron beam defect review subsystem FOV) that have a similar geometry as the chosen SNV location. The optical patch images from these other locations can be used to compare with the patch image around the current SNV patch to predict the other possible defect locations in the electron beam image. Such candidate defect location determination is different from current approaches of using die-to-die comparison on electron beam images to locate defective pixels.

In one such embodiment, the computer subsystem is configured for, based on portions of the electron beam image generated for the other defect at the one or more additional candidate positions, automatically classifying defects detected by the optical inspection system at positions corresponding to the one or more additional candidate positions. In this manner, the computer subsystem may be configured for classifying electron beam images based on training data. In addition, the embodiments described herein can potentially classify substantially large volumes of electron beam images and locate the most likely nuisance sources. For example, the embodiments described herein can be used to automatically classify relatively large amounts of defects into SEM real and SNV bins, instead of comparing the electron beam image versus the neighboring die reference (followed by SEM redetection) which may not produce the exact same location where the inspection tool signal is from. Such capability would allow the optical inspection system to be run much deeper into the noise floor and keep the DOIs having substantially low defect signal at a reasonable nuisance rate which would otherwise have to be sacrificed.

In one embodiment, the defect is one of multiple defects in a sampled set of defects detected by inspection of the wafer performed by the optical inspection system and redetected by the computer subsystem in the images generated by the electron beam defect review subsystem for the wafer, the computer subsystem is configured for performing the steps of determining the first position, determining the second position, and determining the third position for the multiple defects in the sampled set of defects, and determining the association includes determining the association between the first and third positions determined for the multiple defects in the sampled set. For example, in general, a number of defects (e.g., a few thousand defects) in a inspection result may be sampled in any suitable manner known in the art and electron beam images may be generated for those selected defects by a defect review tool such as that described further herein. Those electron beam images may be used to identify SEM-real events, i.e., those events that show a visible defect on the electron beam image. In contrast, SNVs are the events that do not show any visible defect in the electron beam images, and it is generally inconclusive on why that event was flagged as defective by the inspection tool and where the exact location of this event is within the electron beam image. During the training phase, a user may select a relatively small subset of SEM-real defects (e.g., 10 to 15 defects). For each of the defects in the training set, the embodiments may determine the location of the defects on the electron beam images using the electron beam images themselves.

Figure 3:
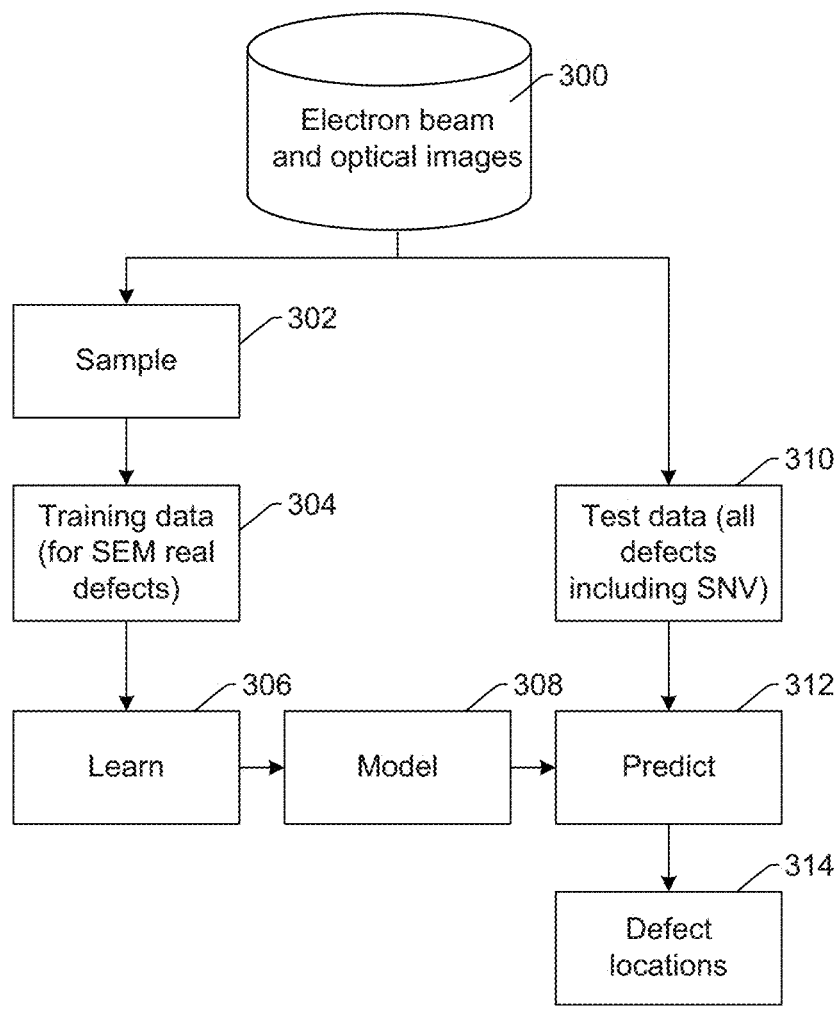
FIG. 3 is a flow chart illustrating steps that may be performed by the embodiments described herein for determining a position of a defect in an electron beam image of a wafer.

In one such embodiment shown in FIG. 3, the computer subsystem may acquire database 300 of electron beam and optical images. The database may have any suitable configuration known in the art. In addition, the database may be stored on any suitable storage medium known in the art including one of those described further herein. The database may also be replaced with any other suitable storage structure known in the art. The electron beam and optical images may be acquired as described herein (e.g., from the electron beam defect review subsystem and the optical inspection system).

As shown in step 302, the computer subsystem may be configured to sample a number of the defects for which the electron beam and optical images have been acquired. In particular, the computer subsystem (or a user) may select a relatively small subset of defects that were detected by inspection and were also redetected by defect review. Although the user may select the subset of defects in the sampling step, the subset of defects may also be selected automatically by the computer subsystem using one or more sampling methods such as diversity sampling and/or random sampling.

The sampling performed in step 302 may produce training data 304 shown in FIG. 3 for the sampled defects (the sample of SEM real defects). For example, the training data may include optical images generated by inspection and corresponding electron beam images for the sampled defects. The user may also provide some inspection-to-defect review mapping. For example, the computer subsystem may be configured to display to a user both the electron beam image and the optical inspection image generated for a defect location detected by inspection. The user may then manually map the defect location in the optical image generated by inspection to the electron beam image.

The computer subsystem may then perform learning step 306 shown in FIG. 3 based on the training data. The learning step may include the steps described herein for determining first, second, and third positions of the defect, which may be performed as described further herein. The learning step may be performed for all of the defects in the sampled set of defects. The learning step may include any other steps described herein (e.g., determining an initial position and then the third position based on the initial position to thereby correct for electron beam image skew). The computer subsystem may then perform modeling step 308 shown in FIG. 3 based on the results of the learning step. In the modeling step, the computer subsystem determines the association between the first and third positions as described further herein. The first and third positions that are used to determine the association may include the first and third positions for all of the defects included in the sampled set of defects.

Once the association has been determined in step 308, the association may be used for predicting step 312 in which for test data 310, which may include all defects detected by inspection including SNVs, defect locations 314 in the electron beam images are determined. Predicting the defect locations in the electron beam images may be performed as described further herein.

In one such embodiment, the optical inspection system has optical characteristics that cause optical distortion in at least two images generated by the optical inspection system for areas on the wafer containing the same patterns, and the sampled set of defects includes defects located in the areas in which the at least two images are generated thereby adapting the determined association to the optical distortion. In this manner, the embodiments described herein can determine the position of defects in an electron beam image while overcoming optical image distortions. In particular, the embodiments described herein provide a methodology for learning optical image distortions using the training data described herein.

In one such example, optical distortions can cause the same wafer pattern to have different image patterns in different images generated by an optical inspection system. For example, images 700, 702, 704, and 706 may be generated for the same wafer pattern. Image 700 is an electron beam image, and images 702, 704, and 706 are optical images. The electron beam image is clearly different from the optical images due to the differences in the way that electrons and light will image the same patterns on the wafer. However, the different optical images are also different from each other due to optical distortions. These differences can be caused by distortions (or errors) in any characteristics of the wafer patterns and/or the optical system. Regardless of where or how the optical distortions cause the variations in the images generated for the same wafer pattern, the image variations pose limitations on direct correlations and alignment of electron beam and optical images. However, the embodiments described herein inherently adapt to these variations by using the training data to learn these differences.

In one embodiment, the computer subsystem is configured for performing the step of determining a position for all defects detected on the wafer by the optical inspection system. For example, the embodiments described herein may use machine-learning principles to automatically identify defect locations of all events detected by an optical inspection system, which may include at least some SNV events, in electron beam images.

In some embodiments, determining the first position of the defect includes upsampling the difference image generated for the defect and determining a center of gravity of a signal corresponding to the defect in the difference image generated for the defect. In one such embodiment, the first position of the defect is determined with sub-pixel accuracy. "Sub-pixel" as that term is used herein is generally defined as smaller than a pixel of an image. In this manner, "sub-pixel accuracy" as that term is used herein can be generally defined as the determination of the position of something (e.g. a defect) with an error smaller than the size (distance from one side to the other) of a single pixel in the image.

In one such example, for each defect in the training data, the computer subsystem may determine the sub-pixel location of the defect signal on the difference image by determining and using the center of gravity of the up-sampled difference image. In particular, the optical image, e.g., a test image, generated for a defect by an optical inspection system may be super-resolved to the pixel size of the electron beam image, which may be performed in any suitable manner known in the art. In addition, another optical image, e.g., a difference image, generated for the defect by the optical inspection system may be super-resolved to the pixel size of the electron beam image, which may be performed in any suitable manner known in the art. Some methods of determining a defect location in the difference image such as determining a peak signal location of a signed-difference image may not be a relatively good indicator of the exact defect location. In contrast, determining a center of gravity of a signed difference image can provide a robust estimate of signal location with sub-pixel accuracy. Because the difference image is generated from the test image and a reference image, the difference image and the test image will have one to one correspondence between the positions in the difference and test images. Therefore, once the first position is determined in the difference image with sub-pixel accuracy, that same position can be identified at its corresponding location in the test image. That position is then detected in the test image with the same accuracy as that with which the position is determined in the difference image (i.e., sub-pixel accuracy).

In another embodiment, the computer subsystem is configured for determining the first position of the other defect by upsampling the other difference image and determining a center of gravity of a signal corresponding to the other defect in the other difference image. In one such embodiment, the first position of the defect is determined with sub-pixel accuracy. For example, for each defect in the test data, the computer subsystem may determine a sub-pixel location of the defect signal in the difference image by determining and using a center of gravity of an up-sampled optical difference image. These steps may be performed as described further herein.

As can be understood from the description of the embodiments provided herein, the embodiments provide a number of advantages for determining the positions of defects detected by inspection in electron beam images generated for defect review. For example, the embodiments described herein provide a way to handle layer visibility differences between electron beam defect review and optical inspection. In particular, the images generated by optical inspection for an area on a wafer can look extremely different from the images for the same area generated by defect review simply due to the differences in the imaging performed by inspection and defect review. However, the embodiments described herein can reliably and accurately determine the positions of defects detected by optical inspection in electron beam images generated for defect review in a robust manner despite any differences between the optical and electron beam images.

Figure 4:
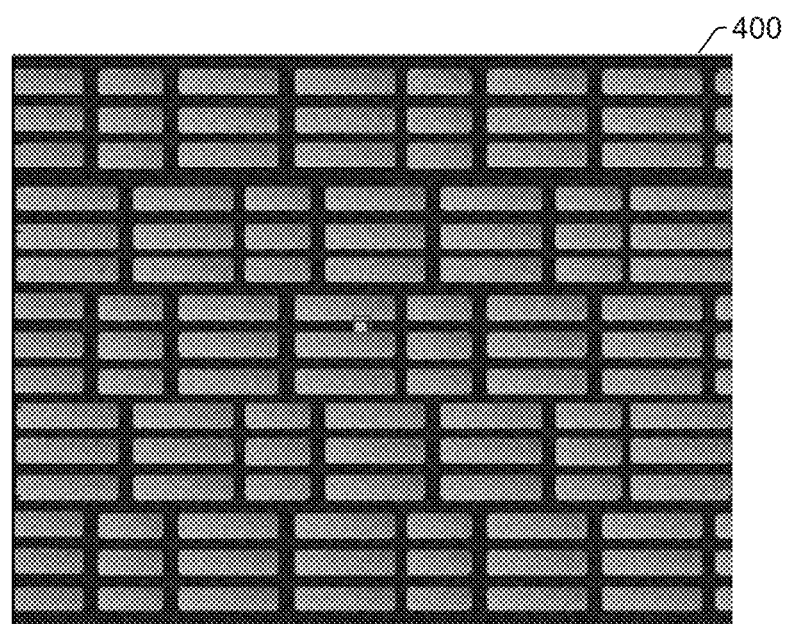
FIG. 4 is an example of an electron beam image generated for a defect on a wafer.
Figure 5:
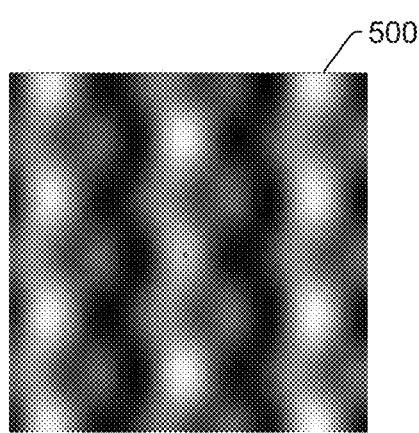
FIG. 5 is an example of a test image generated for an area on a wafer in which a defect is located.

In one such example, FIG. 4 includes an example of electron beam image 400 that may be generated by an electron beam defect review subsystem for an area on a wafer that is centered on a defect location detected by optical inspection. FIG. 5 includes optical image 500 for that same area on the wafer. Optical image 500 may be generated by an optical inspection system such as that described further herein. As can be seen by comparing the images shown in FIGS. 4 and 5, it is quite a challenge (even when viewed with the human eye) to associate these two images as being centered on the same defect location. The challenges arise from the fact that electron beam systems such as those described herein primarily see only the topmost layer of the wafer while an optical system such as those described herein may see the topmost layer on the wafer as well as one or more additional layers formed under the topmost layer (depending on the ability of the light used by the optical system to penetrate into the wafer and be reflected or scattered from a layer under the topmost layer with an intensity that makes that reflected or scattered light detectable by the optical system). In addition, the electron beam will generally be reflected and/or scattered differently compared to how light is reflected and/or scattered. Hence, the image patterns can be quite different for the same wafer location in electron beam images compared to their corresponding optical images. Therefore, trying to directly correlate an electron beam image to an optical image (e.g., with up-sampling for differences in pixel size/resolution) will, most often, be a fruitless exercise due to the fundamental differences in imaging methodology between the two tools.

The embodiments described herein overcome these difficulties by never trying to directly correlate an electron beam image to its respective optical image. In addition, the embodiments described herein generate a model from the training data, and only this model from electron beam image is compared to the model from the optical image.

Figure 6:
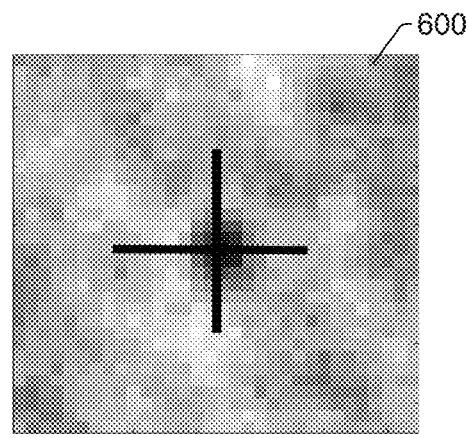
FIG. 6 is an example of a difference image generated for a wafer.
Figure 7:
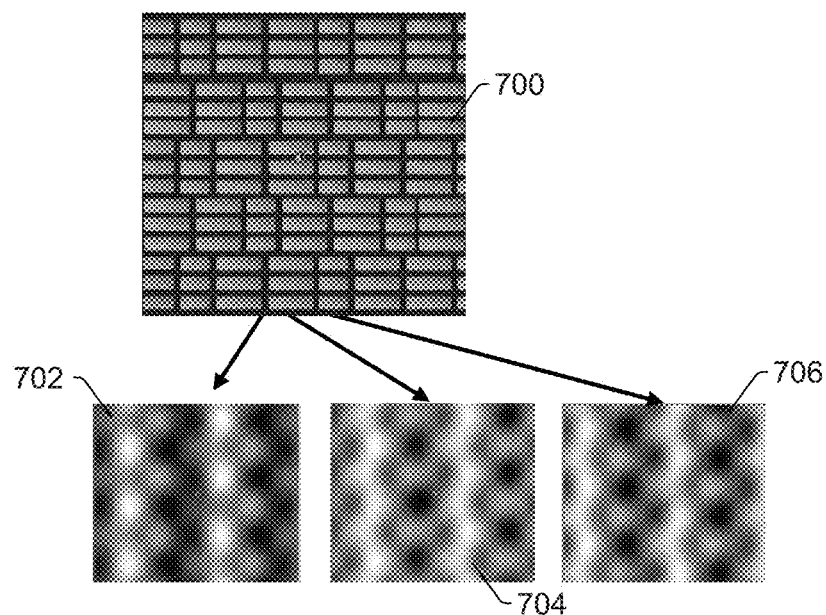
FIG. 7 is an example of an electron beam image generated for a defect on a wafer and multiple images, which are generated by an optical inspection system for areas on the wafer containing the same patterns, and which have different optical distortions due to optical characteristics of the optical inspection system.

In another example, the embodiments described herein can be configured to handle skew in the electron beam imaging method. For example, in the ideal case, the defect always appears in the center of the electron beam patch image generated for the location of the defect. In the actual case, due to the electron beam image skew, the defect can lie anywhere within the patch. For example, FIG. 6 shows an example of difference image 600 generated for a defect detected by optical inspection. The defect location may be determined using the difference image and may be determined at the intersection of the two black lines shown in the difference image. An electron beam image may be generated for this defect location with an electron beam defect review subsystem as described herein. In this manner, it is assumed that the defect location determined in the difference image will be located at the center of the electron beam image. For example, the defect location would be located at the center of the electron beam image shown in FIG. 4. However, as shown in the electron beam image of FIG. 4, there are many locations within the electron beam image that have the same spatial relationship to the patterns in the electron beam image as the spatial relationship between the assumed location of the defect (at the location at the center of the electron beam image) with respect to the patterns in the electron beam image. Therefore, it can be difficult to know for certain which of those locations with respect to the pattern is the actual one that corresponds to the defect location reported by optical inspection. However, the embodiments described herein can be configured to eliminate defect location uncertainty in the electron beam images due to skew by accounting for any de-skew when determining the third position as described further herein.

The embodiments described herein also are capable of sub-pixel accuracy for determining the positions of optically detected defects in electron beam images for defect review. For example, as described herein, the embodiments may be configured for locating the defect signal location within the optical image with sub-pixel accuracy, which is critical for locating the defect in the electron beam image with sub-pixel accuracy. In addition, the embodiments described herein are capable of handling optical distortions in optical images generated by wafer inspection. In particular, the embodiments described herein can reliably and accurately determine the positions of defects detected by optical inspection in electron beam images generated for defect review in a robust manner despite any distortion in the optical images caused by the optical inspection system. The embodiments described herein are also capable of handling multiple sources of uncertainty that may otherwise decrease the accuracy of the defect location determination in the electron beam images. For example, the embodiments described herein can inherently handle layer visibility differences, optical inspection tool distortions, defect review tool location uncertainty errors, sub-pixel defect location uncertainty inside the optical image patch, etc.

In a further example, the embodiments described herein are capable of resolving cell uncertainty in the predicted positions in the electron beam images of the optically detected defects. Furthermore, the embodiments described herein are capable of reliably and accurately predicting the positions of SNVs in electron beam images. In addition, the embodiments described herein help in locating defect signal locations on electron beam images even for SNVs.

As an alternative to the embodiments described herein, there is the ideal case in which both the optical inspection system and the defect review tool have no defect location accuracy error and there is no de-skew issue between the optical inspection tool and the defect review tool. In this case, all of the defects detected by the optical inspection system should appear at the exact same location on the electron beam images, both electron beam real defect and SNV images, and the user should be able to predict the exact locations the optical inspection system has signal on the electron beam images. However, in reality, it is almost impossible to create a situation like the ideal one described above. In particular, all systems and methods have inherent errors due to the limitations of what is achievable in physical reality. Furthermore, attempting to create the ideal situation described above would be prohibitively expensive and time consuming. Therefore, it is not possible, or perhaps not even desirable, to create an ideal situation that has none of the limitations or uncertainties that the embodiments described herein can be used to correct.

Another embodiment relates to a computer-implemented method for determining a position of a defect in an electron beam image of a wafer. The method includes the steps described above.

Each of the steps of the method may be performed as described further herein. The method may also include any other step(s) that can be performed by the electron beam defect review subsystem and/or computer subsystem(s) or system(s) described herein. The steps are performed by a computer system, which may be configured according to any of the embodiments described herein. In addition, the method described above may be performed by any of the system embodiments described herein.

Figure 8:
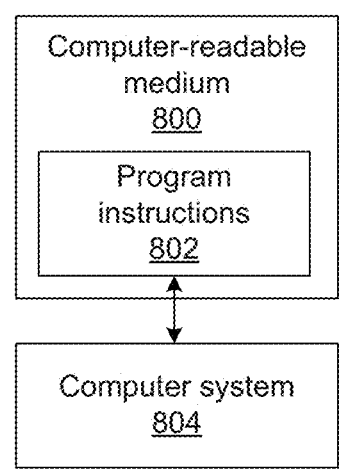
FIG. 8 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for determining a position of a defect in an electron beam image of a wafer. One such embodiment is shown in FIG. 8. In particular, as shown in FIG. 8, non-transitory computer-readable medium 800 includes program instructions 802 executable on computer system 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 804 may be configured according to any of the embodiments described herein.

Further modifications and alternative embodiments of various aspects of the invention will be apparent to those skilled in the art in view of this description. For example, methods and systems for determining a position of a defect in an electron beam image of a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for determining a position of a defect in an electron beam image of a wafer, comprising:
   an electron beam defect review subsystem comprising at least an electron beam source and a detector, wherein the electron beam source is configured to generate electrons that are directed to a wafer, and wherein the detector is configured to detect electrons from the wafer and to generate electron beam images responsive to the detected electrons; and
   a computer subsystem coupled to the electron beam defect review subsystem, wherein the computer subsystem comprises one or more processors that execute instructions from a memory medium, and wherein the computer subsystem is configured for:
      determining a first position of a defect in a difference image generated for the wafer, wherein the difference image is generated by subtracting a reference image from a test image for an area on the wafer in which the defect is located, wherein the test image is generated for the wafer by an optical inspection system, and wherein the defect is detected on the wafer by the optical inspection system;
      determining a second position of the defect with respect to optical image patterns in the test image based on the first position of the defect in the difference image;
      determining a third position of the defect with respect to electron beam image patterns in an electron beam image generated for the defect on the wafer by the electron beam defect review subsystem;
      determining an association between the first and third positions; and
      determining a position of another defect in an electron beam image generated for the other defect on the wafer by the electron beam defect review subsystem, wherein the position of the other defect is determined based on a first position of the other defect in another difference image generated for the wafer and the determined association, wherein the other defect is detected on the wafer by the optical inspection system, wherein the other difference image is generated by subtracting a reference image from a test image for an area on the wafer in which the other defect is located, and wherein the test image used to generate the other difference image is generated for the wafer by the optical inspection system.

2. The system of claim 1, wherein the optical image patterns and the electron beam image patterns comprise repeating patterned features.

3. The system of claim 1, wherein the optical image patterns and the electron beam image patterns correspond to device features in a design for the wafer.

4. The system of claim 1, wherein the optical image patterns and the electron beam image patterns are located in an array region of a design for the wafer.

5. The system of claim 1, wherein the area on the wafer in which the other defect is located contains no alignment sites.

6. The system of claim 1, wherein the other defect cannot be imaged by the electron beam defect review subsystem.

7. The system of claim 1, wherein the other defect can be imaged by the electron beam defect review subsystem.

8. The system of claim 1, wherein determining the third position comprises determining an initial position of the defect with respect to the electron beam image patterns in the electron beam image generated for the defect and correcting the initial position for deviations of the initial position from a center of the electron beam image generated for the defect thereby determining the third position.

9. The system of claim 8, wherein the computer subsystem is further configured for determining one or more additional candidate positions for the other defect in the electron beam image generated for the other defect and determining a confidence score for the one or more additional candidate positions based on a difference between the initial position and the third position.

10. The system of claim 1, wherein the computer subsystem is further configured for determining one or more additional candidate positions for the other defect in the electron beam image generated for the other defect by comparing the test image generated for the other defect with other test images generated for one or more additional areas on the wafer by the wafer inspection system, and wherein the one or more additional areas are located within a field of view of the electron beam defect review subsystem with which the image for the other defect was generated.

11. The system of claim 10, wherein the computer subsystem is further configured for, based on portions of the electron beam image generated for the other defect at the one or more additional candidate positions, automatically classifying defects detected by the optical inspection system at positions corresponding to the one or more additional candidate positions.

12. The system of claim 1, wherein the defect is one of multiple defects in a sampled set of defects detected by inspection of the wafer performed by the optical inspection system and redetected by the computer subsystem in the images generated by the electron beam defect review subsystem for the wafer, wherein the computer subsystem is further configured for performing said determining the first position, determining the second position, and determining the third position for the multiple defects in the sampled set of defects, and wherein determining the association comprises determining the association between the first and third positions determined for the multiple defects in the sampled set.

13. The system of claim 12, wherein the optical inspection system has optical characteristics that cause optical distortion in at least two images generated by the optical inspection system for areas on the wafer containing the same wafer patterns, and wherein the sampled set of defects comprises defects located in the areas in which the at least two images are generated thereby adapting the determined association to the optical distortion.

14. The system of claim 1, wherein the computer subsystem is further configured for performing said determining a position for all defects detected on the wafer by the optical inspection system.

15. The system of claim 1, wherein determining the first position of the defect comprises upsampling the difference image generated for the defect and determining a center of gravity of a signal corresponding to the defect in the difference image generated for the defect.

16. The system of claim 15, wherein the first position of the defect is determined with sub-pixel accuracy.

17. The system of claim 1, wherein the computer subsystem is further configured for determining the first position of the other defect by upsampling the other difference image and determining a center of gravity of a signal corresponding to the other defect in the other difference image.

18. The system of claim 17, wherein the first position of the other defect is determined with sub-pixel accuracy.

19. A non-transitory computer-readable medium, storing program instructions executable on a computer system for performing a computer-implemented method for determining a position of a defect in an electron beam image of a wafer, wherein the computer-implemented method comprises:

determining a first position of a defect in a difference image generated for a wafer, wherein the difference image is generated by subtracting a reference image from a test image for an area on the wafer in which the defect is located, wherein the test image is generated for the wafer by an optical inspection system, and wherein the defect is detected on the wafer by the optical inspection system;

determining a second position of the defect with respect to optical image patterns in the test image based on the first position of the defect in the difference image;

generating an electron beam image for the defect on the wafer with an electron beam defect review subsystem, wherein the electron beam defect review subsystem comprises at least an electron beam source and a detector, wherein the electron beam source is configured to generate electrons that are directed to a wafer, wherein the detector is configured to detect electrons from the wafer and to generate electron beam images responsive to the detected electrons, wherein the computer system is coupled to the electron beam defect review subsystem, and wherein the computer system comprises one or more processors that execute instructions from a memory medium;

determining a third position of the defect with respect to electron beam image patterns in the electron beam image generated for the defect on the wafer by the electron beam defect review subsystem;

determining an association between the first and third positions; and determining a position of another defect in an electron beam image generated for the other defect on the wafer by the electron beam detect review subsystem, wherein the position of the other defect is determined based on a first position of the other defect in another difference image generated for the water and the determined association, wherein the other defect is detected on the wafer by the optical inspection system, wherein the other difference image is generated by subtracting a reference image from a test image for an area on the wafer in which the other defect is located, wherein the test image used to generate the other difference image is generated for the wafer by the optical inspection system, and wherein determining the first, second, and third positions, the association, and the position are performed by the computer system.

20. A computer-implemented method for determining a position of a defect in an electron beam image of a wafer, comprising:

determining a first position of a defect in a difference image generated for a wafer, wherein the difference image is generated by subtracting a reference image from a test image for an area on the wafer in which the defect is located, wherein the test image is generated for the wafer by an optical inspection system, and wherein the detect is detected on the wafer by the optical inspection system;

determining a second position of the defect with respect to optical image patterns in the test image based on the first position of the defect in the difference image;

generating an electron beam image for the defect on the wafer with an electron beam defect review subsystem, wherein the electron beam defect review subsystem comprises at least an electron beam source and a detector, wherein the electron beam source is configured to generate electrons that are directed to a wafer, wherein the detector is configured to detect electrons from the wafer and to generate electron beam images responsive to the detected electrons, wherein a computer system is coupled to the electron beam defect review subsystem, and wherein the computer system comprises one or more processors that execute instructions from a memory medium;

determining a third position of the defect with respect to electron beam image patterns in the electron beam image generated for the defect on the wafer by the electron beam defect review subsystem;

determining an association between the first and third positions; and determining a position of another defect in an electron beam image generated for the other defect on the wafer by the electron beam defect review subsystem, wherein the position of the other defect is determined based on a first position of the other defect in another difference image generated for the wafer and the determined association, wherein the other defect is detected on the wafer by the optical inspection system, wherein the other difference image is generated by subtracting a reference image from a test image for an area on the wafer in which the other defect is located, wherein the test image used to generate the other difference image is generated for the wafer by the optical inspection system, and wherein determining the first, second, and third positions, the association, and the position are performed by the computer system.

* * * * *